United States Patent
Wu et al.

(10) Patent No.: US 10,170,516 B2
(45) Date of Patent: Jan. 1, 2019

(54) IMAGE SENSING DEVICE AND METHOD FOR FABRICATING THE SAME

(71) Applicant: VisEra Technologies Company Limited, Hsin-Chu (TW)

(72) Inventors: Han-Lin Wu, Hsin-Chu (TW);
Chin-Chuan Hsieh, Hsin-Chu (TW);
Chin-Ching Chang, Hsin-Chu (TW)

(73) Assignee: VISERA TECHNOLOGIES COMPANY LIMITED, Hsin-Chu (TW)

(*) Notice: Subject to any disclaimer, the term of this patent is extended or adjusted under 35 U.S.C. 154(b) by 618 days.

(21) Appl. No.: 14/339,238

(22) Filed: Jul. 23, 2014

(65) Prior Publication Data

US 2016/0027829 A1    Jan. 28, 2016

(51) Int. Cl.
*H01L 27/00* (2006.01)
*H01L 27/146* (2006.01)

(52) U.S. Cl.
CPC .. *H01L 27/14685* (2013.01); *H01L 27/14627* (2013.01); *H01L 27/14629* (2013.01); *H01L 27/14621* (2013.01); *H01L 27/14625* (2013.01)

(58) Field of Classification Search
CPC ......... H01L 27/14625; H01L 27/14627; H01L 27/14629; H01L 27/14685; H01L 27/146
See application file for complete search history.

(56) References Cited

U.S. PATENT DOCUMENTS

| | | | | |
|---|---|---|---|---|
| 6,172,723 B1* | 1/2001 | Inoue | ............... | G02F 1/133553 349/110 |
| 7,816,641 B2* | 10/2010 | Tay | ................... | H01L 27/14625 250/226 |
| 2009/0166518 A1 | 7/2009 | Tay et al. | | |
| 2009/0242736 A1* | 10/2009 | Rennie | ............. | H01L 27/14621 250/208.1 |
| 2011/0234121 A1* | 9/2011 | Ding | .................. | H05B 33/0869 315/294 |
| 2012/0223214 A1 | 9/2012 | Lee et al. | | |
| 2015/0116575 A1* | 4/2015 | Ferraris | ............. | G02B 13/0055 348/342 |

FOREIGN PATENT DOCUMENTS

| CN | 1716035 A | 1/2006 |
|---|---|---|
| CN | 101364261 A | 2/2009 |

(Continued)

OTHER PUBLICATIONS

An Office Action from the corresponding Taiwanese application dated Jul. 25, 2016, 5 pages.

(Continued)

*Primary Examiner* — Mounir Amer
*Assistant Examiner* — Alexander Belousov
(74) *Attorney, Agent, or Firm* — Muncy, Geissler, Olds & Lowe, P.C.

(57) ABSTRACT

An image sensing device is provided. The image sensing device includes a substrate having a pixel array with a plurality of pixels. A light guide structure is disposed over the substrate, forming a plurality of light pipes and a plurality of reflecting portions surrounding the light pipes. The light pipes are aligned with the pixels of the pixel array. The invention also provides a method for fabricating the image sensing device.

19 Claims, 9 Drawing Sheets

(56) References Cited

FOREIGN PATENT DOCUMENTS

| | | |
|---|---|---|
| CN | 101546778 A | 9/2009 |
| CN | 101809743 A | 8/2010 |
| CN | 102207581 A | 10/2011 |
| TW | 200950070 | 12/2009 |
| TW | 201415616 | 4/2014 |

OTHER PUBLICATIONS

An Office Action from corresponding CN Application No. 201410798734.9 dated Oct. 24, 2017; 7 pgs.

* cited by examiner

IMAGE SENSING DEVICE AND METHOD FOR FABRICATING THE SAME

BACKGROUND OF THE INVENTION

Field of the Invention

The present application relates to an optoelectronic device, and more particularly to an image sensing device and a method for fabricating the same.

Description of the Related Art

In recent years, electronic consumer products such as digital cameras, digital video recorders, and mobile phones having image sensing devices capable of capturing images have become more and more popular. Accordingly, the demand for image sensing devices has increased. An image sensing device can receive a light signal and convert the light signal into an electronic signal. After processing the electronic signal, a digital image can be generated. In general, image sensing devices can be categorized into two types: charge coupled devices (CCD) and complementary metal oxide semiconductor (CMOS) devices.

FIG. 1A is a sectional view of a conventional CMOS-type image sensing device 10. The image sensing device 10 typically comprises a silicon substrate 100 having a pixel array therein. Each pixel of the pixel array includes a photoelectric conversion unit 102, such as a photodiode, generating an electronic signal corresponding to the intensity of light. Here, only four pixels 100a, 100b, 100c, and 100d of the pixel array are shown in FIG. 1 for illustration. When light is focused on the photoelectric conversion units 102 of the pixel array, electronic signals can be generated to display a corresponding digital image. A microlens array 106 is disposed above the pixel array for focusing light on the photoelectric conversion units 102. Furthermore, a color filter array 104 is disposed between the pixel array and the microlens array 106, allowing the pixels 100a-100d to collect light with specific wavelengths.

FIG. 1B is a sectional view of a conventional image sensing system which comprises the image sensing device 10 as shown in FIG. 1A and a module lens 20 disposed above the image sensing device 10. When light passes through the module lens 20, it may spread out in a wide range, as indicated by the arrows in FIG. 1B. Thus, the incident angle of the light (i.e. chief ray angle (CRA)) at the periphery of the microlens array 106 is usually larger than that at the center of the microlens array 106. As a result, the focal length at the periphery of the microlens array 106 is shallower than that at the center of the microlens array 106, such that the intensity of the light to each photoelectric conversion unit 102 is reduced. The reduction of light intensity not only enhances cross-talk between the pixels 100a-100d but also reduces the signal-to-noise ratio (SNR) and photosensitivity of the image sensing device 10. Therefore, to develop a novel image sensing device with high quantum efficiency of the pixels and low cross-talk between the pixels has become a critical issue.

BRIEF SUMMARY OF THE INVENTION

A detailed description is given in the following embodiments with reference to the accompanying drawings. An image sensing device and a fabrication method thereof are provided.

An embodiment of an image sensing device comprises a substrate comprising a pixel array having a plurality of pixels. A light guide structure is disposed over the substrate, forming a plurality of light pipes and a plurality of reflecting portions surrounding the light pipes. The light pipes are aligned with the pixels of the pixel array.

An embodiment of a method for fabricating an image sensing device comprising a substrate is provided, wherein the substrate comprises a pixel array having a plurality of pixels. A photosensitive layer is formed over the substrate. An exposure process is performed on the photosensitive layer to form a plurality of light pipes and a plurality of reflecting portions, wherein the light pipes are aligned with the pixels of the pixel array.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1A:
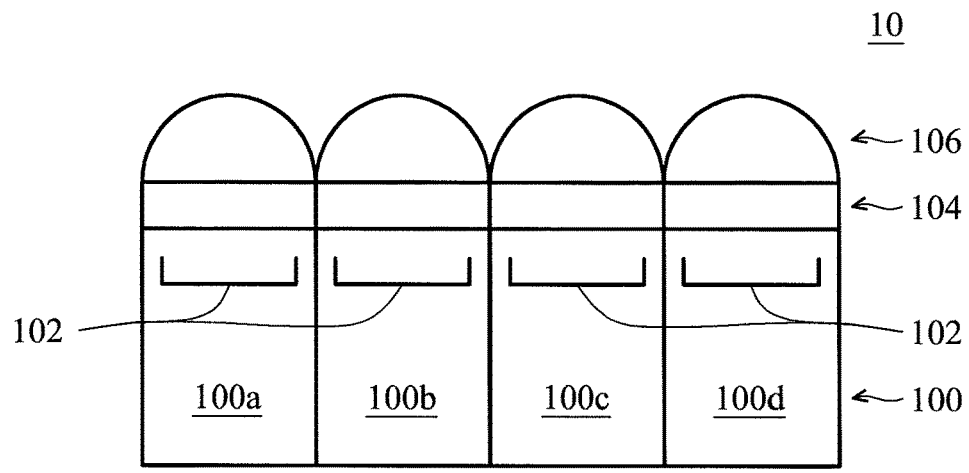
FIG. 1A is a sectional view of a conventional image sensing device.
Figure 1B:
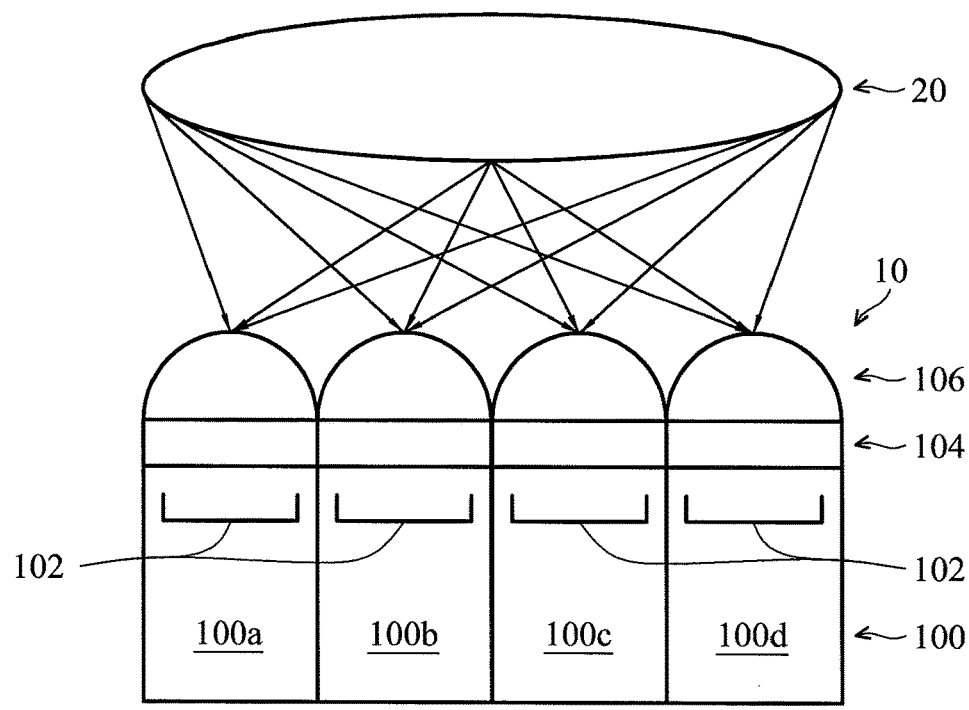
FIG. 1B is a sectional view of a conventional image sensing device coupled with a module lens.
Figure 2A:
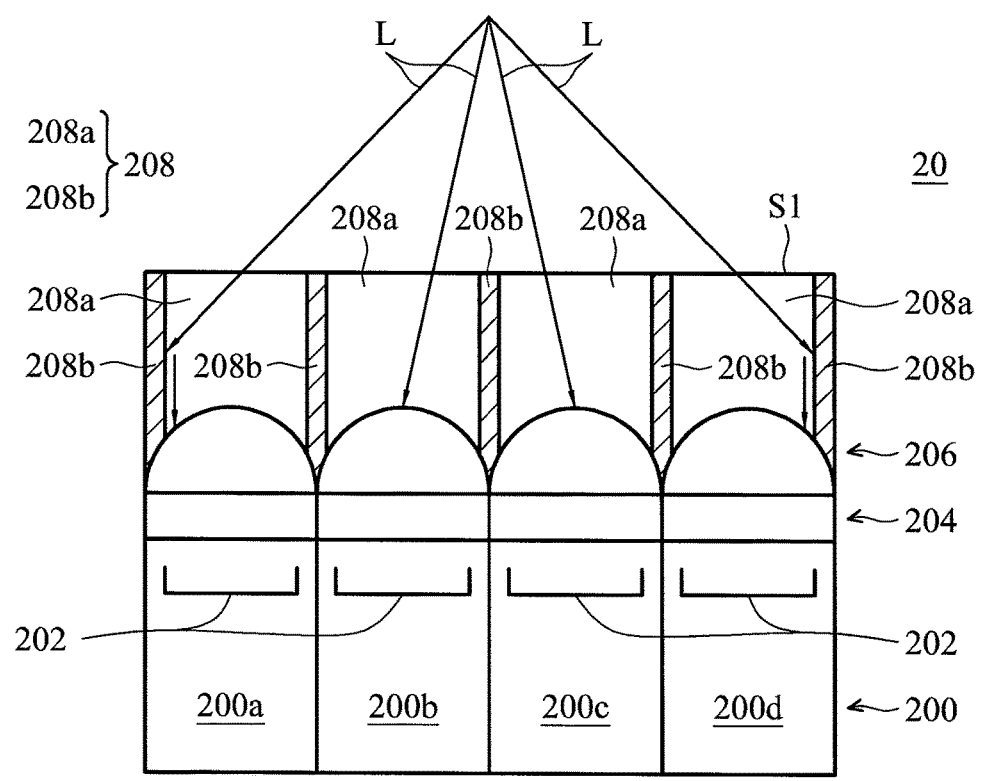
FIG. 2A is a sectional view of an image sensing device according to an embodiment of the invention.

FIG. 2A is a sectional view of an image sensing device according to an embodiment of the invention. The image sensing device 20 comprises a substrate 200 having a pixel array therein. To simplify the diagram and the description, only four pixels 200a, 200b, 200c, and 200d of the pixel array are depicted in FIG. 2A for illustration. In this embodiment, the substrate 200 may be a bulk silicon substrate or other semiconductor substrate comprising silicon, germanium, carbon, or a combination thereof. Moreover, each of the pixels 200a-200d includes a photoelectric conversion unit 202, such as a photodiode, so as to receive light with specific wavelengths and generate an electronic signal corresponding to the intensity of the light.

As shown in FIG. 2A, a color filter array 204 is disposed on the substrate 200, and a microlens array 206 is disposed on the color filter array 204. In this embodiment, the color filter array 204 may include red, green, and blue color filters corresponding to the pixels 200a-200d, thus allowing the pixels 200a-200d to collect light with specific wavelengths. The microlens array 206 includes several microlenses aligned with the pixels 200a-200d of the pixel array for focusing light on the photoelectric conversion units 202.

Figure 2B:
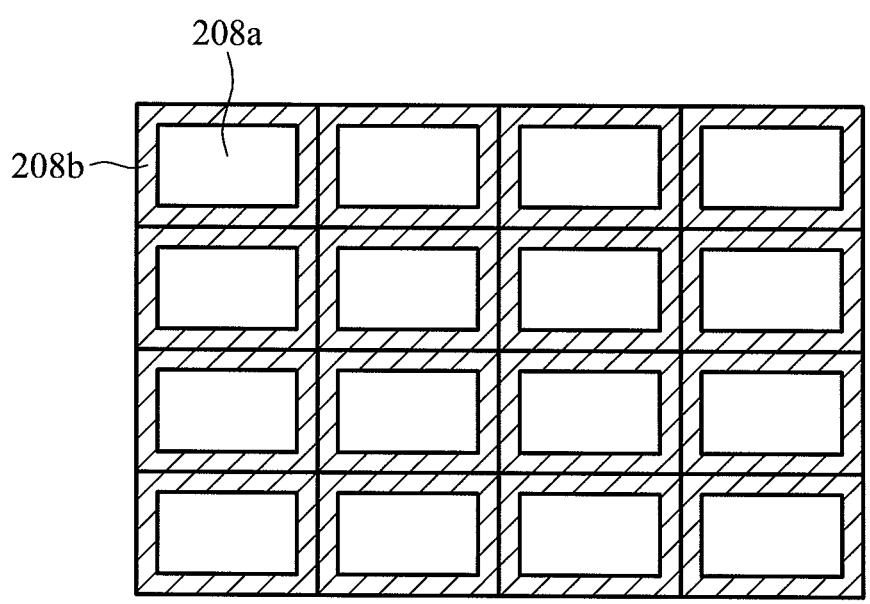
FIG. 2B is a top view of the image sensing device in FIG. 2A.

A light guide structure 208 is disposed on the microlens array 206 above the substrate 200 and the color filter array 204. The light guide structure 208 forms a flat light incident surface S1 opposite to the substrate 200 and includes a plurality of light pipes 208a and reflecting portions 208b. Specifically, the light pipes 208a are respectively aligned with the pixels 200a-200d of the pixel array and surrounded by the reflecting portions 208b (FIGS. 2A and 2B). In this embodiment, when light L enters the light guide structure 208, the light pipes 208a allow the light L propagating therethrough, and the reflecting portions 208b can perform total internal reflection of the light L within the light pipes 208a, as the arrows indicate in FIG. 2A. Accordingly, the light L can be directed along the light pipes 208a to vertically impinge on the top surfaces of the microlens array 206. Consequently, the collimated light can be focused on each photoelectric conversion unit 202 within the pixels 200a-200d.

With the light pipes 208a and the reflecting portions 208b of the light guide structure 208, the light L can be efficiently collimated and directed to the microlens array 206, such that the intensity of the light focused onto the photoelectric conversion units 202 can be enhanced. Therefore, quantum efficiency of the pixels 200a-200d is improved, and crosstalk between the pixels 200a-200d is reduced.

Figure 3A:
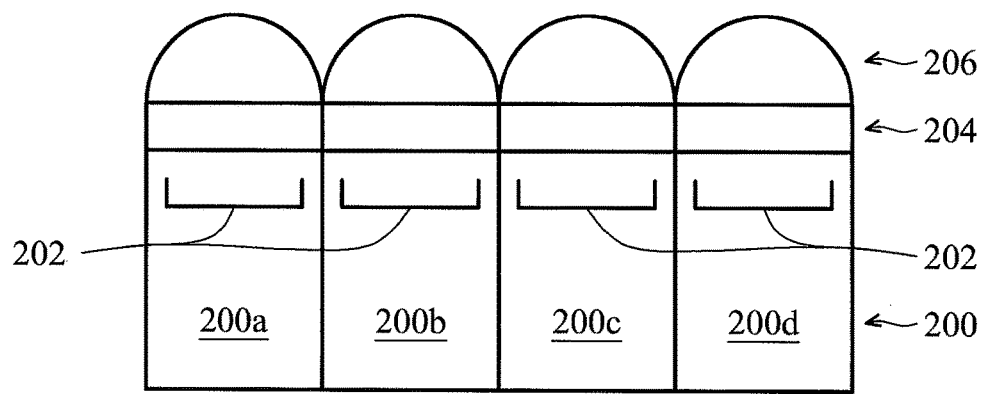
FIG. 3A-3C are sectional views illustrating a method for fabricating the image sensing device 20 in FIG. 2A according to an embodiment of the invention.
Figure 3B:
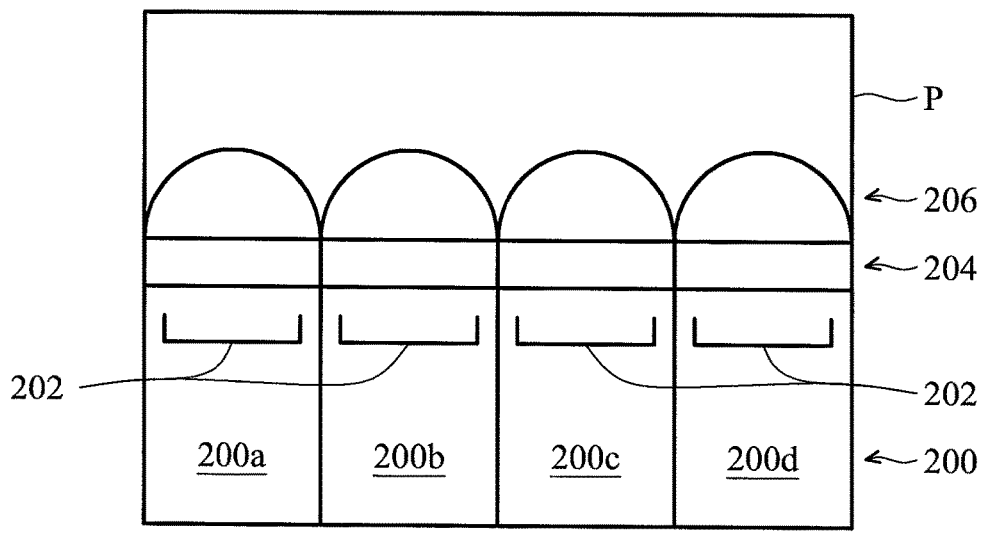
Figure 3C:
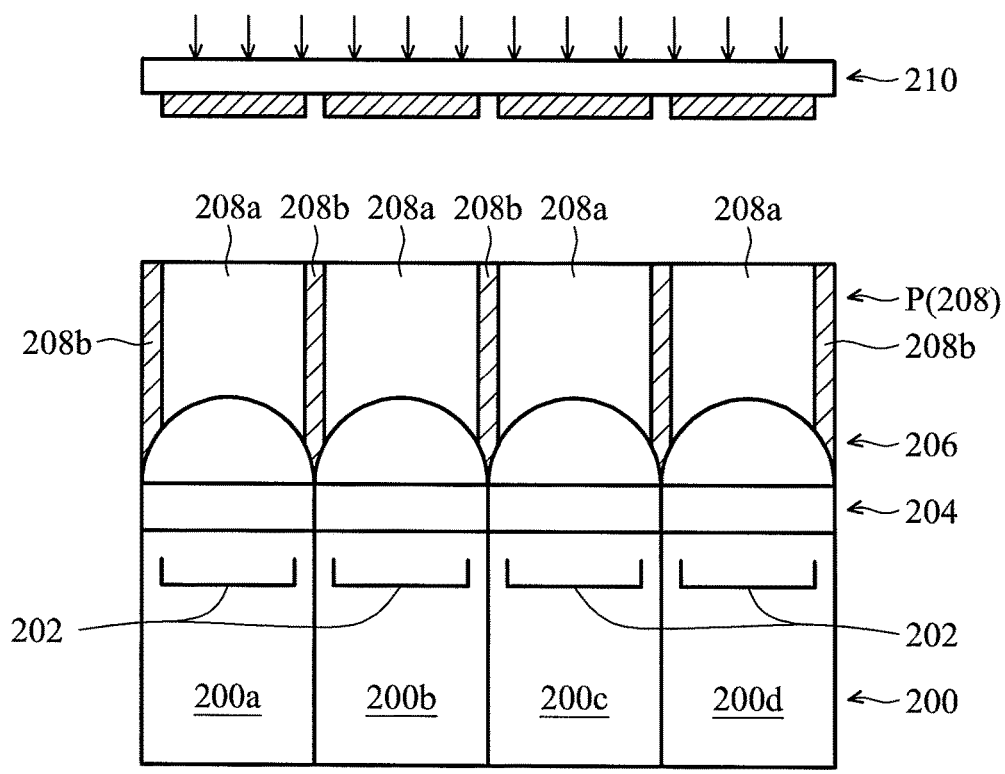

FIGS. 3A-3C are sectional views illustrating an embodiment of a method for fabricating the image sensing device 20 of FIG. 2A. First, a substrate 200 having a pixel array with pixels 200a-200d is provided (FIG. 3A), wherein the substrate 200 may be a silicon substrate containing transistors, resistors, and other semiconductor elements. Here, each of the pixels 200a-200d includes a photoelectric conversion unit 202. The photoelectric conversion unit 202 may comprise photodiodes, phototransistors, or other photosensors for converting a light signal into an electronic signal.

Subsequently, a color filter array 204 including red, green, and blue color filters is formed on the substrate 200 by photolithography, corresponding to the pixels 200a-200d and the photoelectric conversion units 202. After the color filter array 204 formed on the substrate 200, a microlens array 206 including a plurality of dome-type microlenses is formed on the color filter array 204 above the substrate 200, wherein the dome-type microlenses of the microlens array 206 correspond to the photoelectric conversion units 202 in the pixels 200a-200d. In this embodiment, the microlens array 206 may be formed by coating a resin material on the color filter array 204, and the resin material is then patterned by photolithography. A thermal flow process can be performed on the patterned resin material, thereby forming the dome-type microlenses of the microlens array 206.

Referring to FIG. 3B, after the microlens array 206 is formed on the color filter array 204, a photosensitive layer P is formed on the microlens array 206 above the substrate 200 and the color filter array 204. The photosensitive layer P may comprise polysiloxane, silicon dioxide, titanium dioxide, propylene glycol monomethyl ether acetate, diaceton alcohol, methanol, mesityl oxide, or a combination thereof.

As shown in FIG. 3C, an exposure process is performed on the photosensitive layer P by using a gray level mask 210. In this embodiment, the gray level mask 210 has a grating structure for providing different intensities of light impinging onto the photosensitive layer P. After the exposure process performed on the photosensitive layer P through the gray level mask 210, the unexposed and exposed portions of the photosensitive layer P can be cured by heat or light. Thus, the unexposed portions of the photosensitive layer P can form the light pipes 208a of the light guide structure 208, and the exposed portions of the photosensitive layer P can form the reflecting portions 208b of the light guide structure 208 (FIG. 3C). In some embodiments, the exposed portions of the photosensitive layer P can also form the light pipes 208a of the light guide structure 208, and the unexposed portions of the photosensitive layer P can also form the reflecting portions 208b of the light guide structure 208. It should be noted that the light pipes 208a are respectively aligned with the pixels 200a-200d of the substrate 200 and surrounded by the reflecting portions 208b.

In this embodiment, a refractive index of the light pipes 208a is greater than a refractive index of the reflecting portions 208b. In some embodiments, a difference between the refractive index of the light pipes 208a and the refractive index of the reflecting portions 208b is greater than 0.1 and less than 0.2. Thus, when light L within the light pipes 208a impinge on the interfaces between the reflecting portions 208b and the light pipes 208a, total internal reflection of the light L may occur, such that the light L can be vertically directed through the light pipes 208a to the corresponding pixels 200a-200d, even when the light L has a large incident angle (CRA) at the periphery of the microlens array 206 (as the arrows indicate in FIG. 2A).

Figure 4:
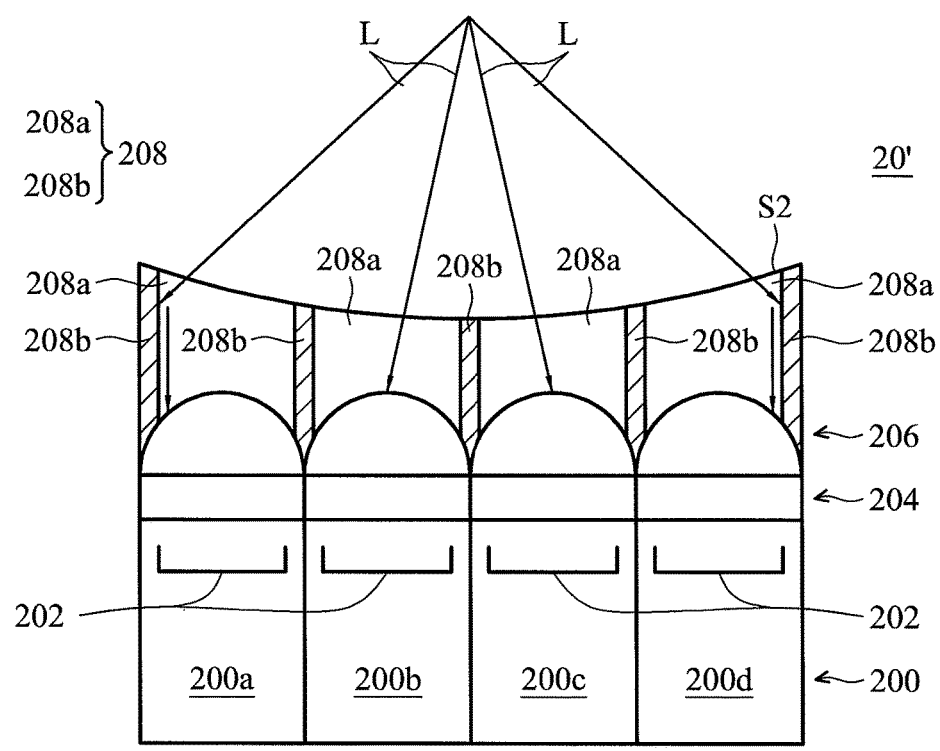
FIG. 4 is a sectional view of an image sensing device according to another embodiment of the invention.
Figure 5:
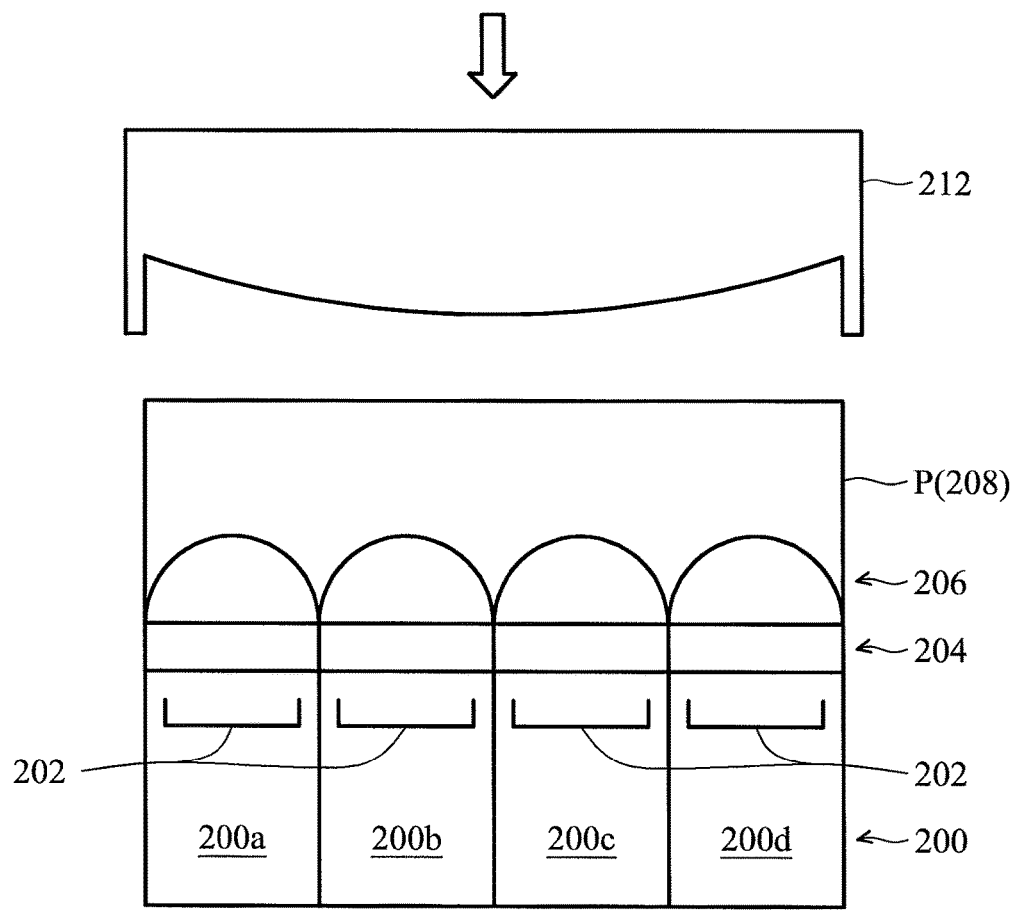
FIG. 5 is a sectional view showing a molding process performed on a photosensitive layer to form the image sensing device in FIG. 4.

FIG. 4 is a sectional view of an image sensing device according to another embodiment of the invention. Comparing the image sensing device 20' in FIG. 4 with the image sensing device 20 in FIG. 2A, the light guide structure 208 of the image sensing device 20' in FIG. 4 forms a concave light incident surface S2 opposite to the substrate 200. As shown in FIG. 5, the concave light incident surface S2 can be formed by performing a molding process on the photosensitive layer P with a mold 212 before the exposure process.

In this embodiment, the concave light incident surface S2 of the light guide structure 208 can allow the light L with larger CRA to enter the light guide structure 208, as the arrows indicate in FIG. 4. Furthermore, with the concave light incident surface S2 formed on the image sensing device 20', the number of module lenses (not shown) can be reduced, thereby facilitating miniaturization of the image sensing system.

Figure 6:
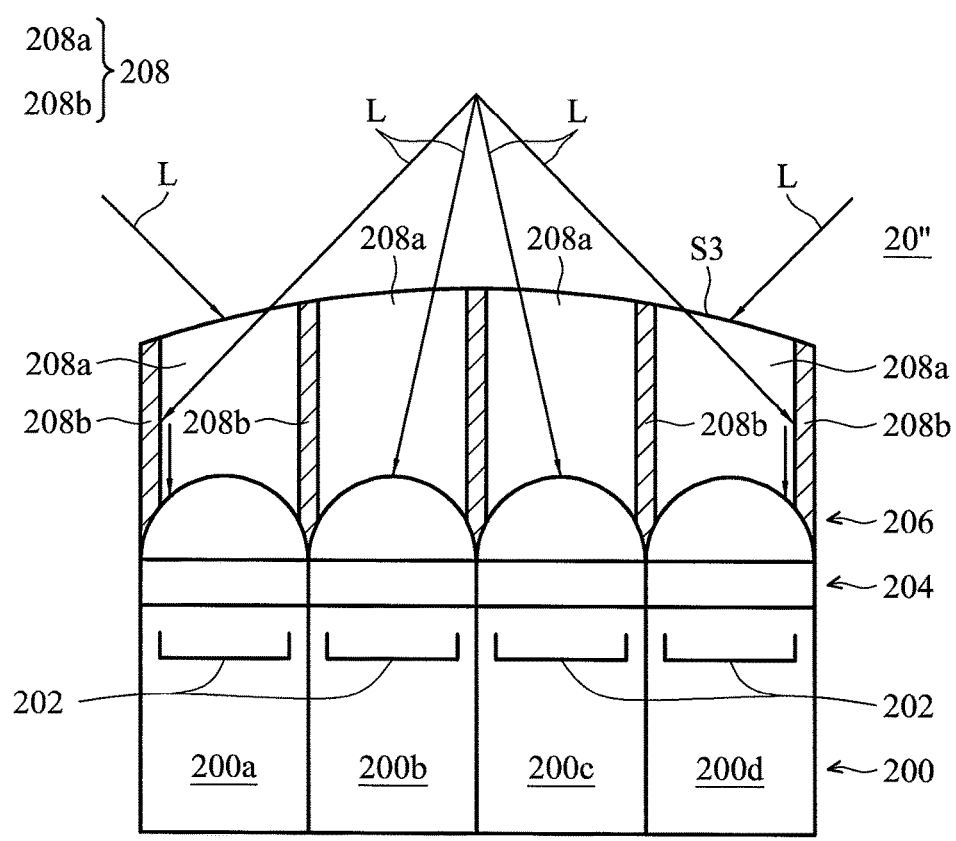
FIG. 6 is a sectional view of an image sensing device according to another embodiment of the invention.
Figure 7:
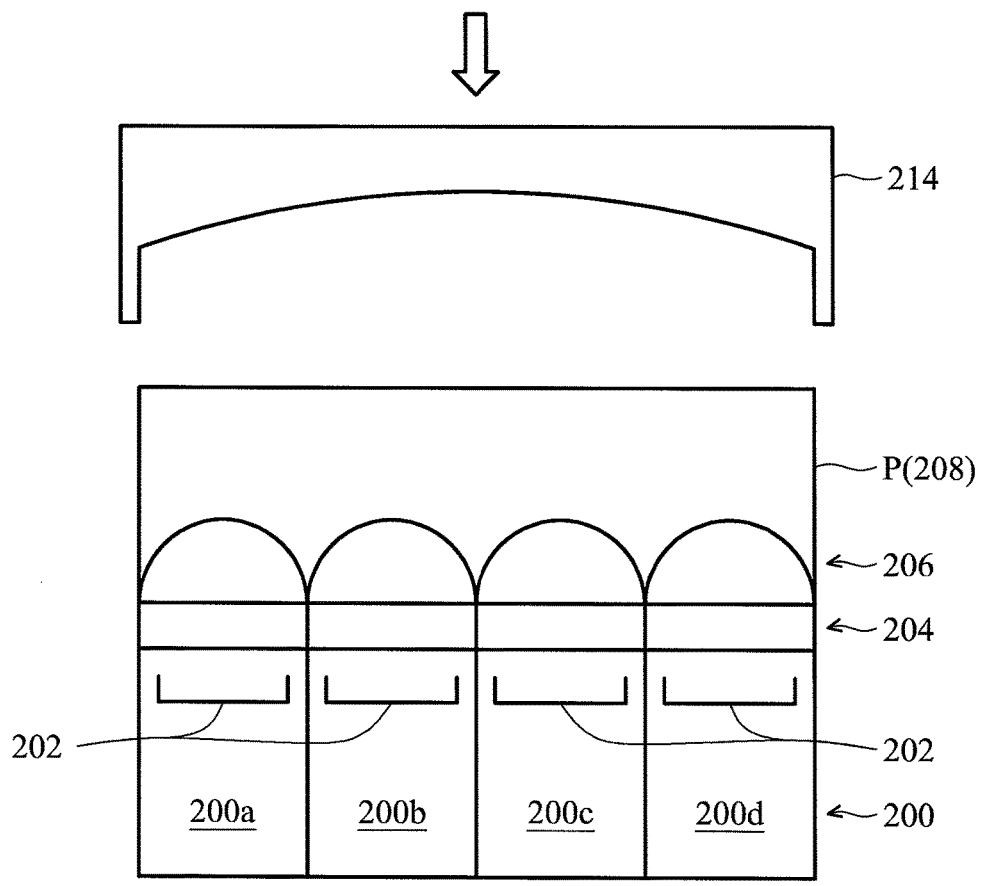
FIG. 7 is a sectional view showing a molding process performed on the photosensitive layer to form the image sensing device in FIG. 6.

FIG. 6 is a sectional view of an image sensing device according to another embodiment of the invention. Comparing the image sensing device 20" in FIG. 6 with the image sensing device 20 in FIG. 2A, the light guide structure 208 of the image sensing device 20" in FIG. 6 forms a convex light incident surface S3 opposite to the substrate 200. As shown in FIG. 7, the convex light incident surface S3 can be formed by performing a molding process on the photosensitive layer P with a mold 214 before the exposure process. Moreover, the convex light incident surface S3 of the light guide structure 208 can enlarge the field of view (FOV) of the image sensing device 20", as indicated by the arrows in FIG. 6.

As described above, the invention provides an image sensing device comprising a light guide structure over a substrate. The light guide structure includes a plurality of light pipes and a plurality of reflecting portions surrounding the light pipes. Specifically, the light pipes are respectively aligned with a plurality of pixels in the substrate, and the reflecting portions can reflect light within the light pipes by total internal reflection. Thus, the light can be efficiently directed through the light pipes onto the photoelectric conversion units of the pixels. As a result, the intensity of the light to each photoelectric conversion unit is enhanced, thereby improving the quantum efficiency of the pixels and reducing cross-talk between the pixels. Moreover, since the light guide structure is formed by performing an exposure process on a photosensitive layer, the light pipes and the reflecting portions of the light guide structure can be easily accomplished.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image sensing device, comprising:
   a substrate, comprising a pixel array having a plurality of pixels;
   a light guide structure, disposed over the substrate, forming a plurality of light pipes and a plurality of reflecting portions defining the light pipes, wherein the light pipes are aligned with the pixels of the pixel array;
   a microlens array, disposed between the substrate and the light guide structure; the microlens array including a plurality of microlenses; and
   a color filter array, disposed between the substrate and the microlens array,
   wherein the substrate, the light guide structure, the microlens array and the color filter array are formed on a single die, and
   wherein each light reflecting portion extends to and contacts an outer edge of at least one of the plurality of microlenses.

2. The image sensing device as claimed in claim 1, wherein a refractive index of the light pipes is greater than a refractive index of the reflecting portions.

3. The image sensing device as claimed in claim 2, wherein a difference between the refractive index of the light pipes and the refractive index of the reflecting portions is greater than 0.1 and less than 0.2.

4. The image sensing device as claimed in claim 1, wherein the light guide structure forms a flat light incident surface.

5. The image sensing device as claimed in claim 1, wherein the light guide structure forms a concave light incident surface.

6. The image sensing device as claimed in claim 1, wherein the light guide structure forms a convex light incident surface.

7. The image sensing device as claimed in claim 1, wherein the light guide structure is a photosensitive layer, and the light pipes are formed from a plurality of unexposed portions of the photosensitive layer, and the reflecting portions are formed from a plurality of exposed portions of the photosensitive layer.

8. The image sensing device as claimed in claim 7, wherein the photosensitive layer comprises polysiloxane, silicon dioxide, titanium dioxide, propylene glycol monomethyl ether acetate, diaceton alcohol, methanol, mesityl oxide, or a combination thereof.

9. The image sensing device as claimed in claim 1, wherein the light guide structure is a photosensitive layer, and the light pipes are formed from a plurality of exposed portions of the photosensitive layer, and the reflecting portions are formed from a plurality of unexposed portions of the photosensitive layer.

10. A method for fabricating an image sensing device, comprising:
    providing a substrate, wherein the substrate comprises a pixel array having a plurality of pixels;
    forming a photosensitive layer over the substrate;
    forming a microlens array between the substrate and the photosensitive layer, the microlens array including a plurality of microlenses;
    forming a color filter array between the substrate and the microlens array; and
    performing an exposure process on the photosensitive layer to form a plurality of light pipes and a plurality of reflecting portions defining the plurality of light pipes, wherein the light pipes are aligned with the pixels of the pixel array, each light reflecting portion extending to and contacting an outer edge of at least one of the plurality of microlenses, wherein
    the substrate, the microlens array, the color filter array, the plurality of light pipes and the plurality of reflecting portions are formed on a single die.

11. The method as claimed in claim 10, wherein the light pipes are formed from a plurality of unexposed portions of the photosensitive layer during the exposure process, and the reflecting portions are formed from a plurality of exposed portions of the photosensitive layer during the exposure process.

12. The method as claimed in claim 10, wherein a refractive index of the light pipes is greater than a refractive index of the reflecting portions.

13. The method as claimed in claim 12, wherein a difference between the refractive index of the light pipes and the refractive index of the reflecting portions is greater than 0.1 and less than 0.2.

14. The method as claimed in claim 10, further comprising:
    forming a curved light incident surface on the photosensitive layer.

15. The method as claimed in claim 14, wherein the curved light incident surface is formed by molding.

16. The method as claimed in claim 14, wherein the curved light incident surface is a concave light incident surface opposite to the substrate.

17. The method as claimed in claim 14, wherein the curved light incident surface is a convex light incident surface opposite to the substrate.

18. The method as claimed in claim 10, wherein the photosensitive layer comprises polysiloxane, silicon dioxide, titanium dioxide, propylene glycol monomethyl ether acetate, diaceton alcohol, methanol, mesityl oxide, or a combination thereof.

19. An image sensing device, comprising:
    a substrate, comprising a pixel array having a plurality of pixels;
    a light guide structure, disposed over the substrate, forming a plurality of light pipes and a plurality of reflecting portions defining the light pipes, wherein the light pipes are aligned with the pixels of the pixel array;
    a microlens array, disposed between the substrate and the light guide structure, the microlens array including a plurality of microlenses; and
    a color filter array, disposed between the substrate and the microlens array,
    wherein each microlens is aligned with a corresponding one of the light pipes, and wherein each light reflecting portion extends to and contacts an outer edge of at least one of the plurality of microlenses.

* * * * *